(12) United States Patent
Kao et al.

(10) Patent No.: US 6,468,870 B1
(45) Date of Patent: Oct. 22, 2002

(54) METHOD OF FABRICATING A LDMOS TRANSISTOR

(75) Inventors: Chi-Hung Kao, Taipei (TW); Shih-Hui Chen, Kaohsiung (TW); Tsung-Yi Huang, Hsin-Chu (TW); Jeng Gong, Hsinchu (TW); Kuo-Shu Huang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/747,137

(22) Filed: Dec. 26, 2000

(51) Int. Cl.[7] .............................................. H01L 21/336
(52) U.S. Cl. ........................ 438/297; 438/294; 438/299; 438/197; 438/135
(58) Field of Search ................................ 438/297, 268, 438/269, 135, 138, 294, 197, 299; 148/DIG. 126

(56) References Cited

U.S. PATENT DOCUMENTS

| 5,242,841 A | | 9/1993 | Smayling et al. ............. 437/29 |
|---|---|---|---|
| 5,382,536 A | * | 1/1995 | Malhi et al. .................. 438/268 |
| 5,474,943 A | | 12/1995 | Hshieh et al. ................. 437/40 |
| 5,491,105 A | | 2/1996 | Smayling et al. .............. 437/54 |
| 5,512,495 A | * | 4/1996 | Mei et al. ..................... 438/268 |
| 5,639,676 A | | 6/1997 | Hshieh et al. .......... 437/40 DM |
| 5,903,032 A | * | 5/1999 | Duvvury ...................... 257/356 |
| 6,251,744 B1 | * | 6/2001 | Su et al. ....................... 438/219 |

* cited by examiner

Primary Examiner—Michael Trinh
(74) Attorney, Agent, or Firm—George O. Saile; Stephen B. Ackerman; William J. Stoffel

(57) ABSTRACT

A method of manufacturing a LDHOS transistor having a dielectric block under the gate electrode. A high voltage well, low voltage well (LV PW), and field oxide regions having bird beaks are provided in a substrate and overlay the high voltage well and the low voltage well. In a key step, a dielectric block is formed over the bird beaks of the field oxide regions. A gate is formed over the dielectric block. After this the LDMOS device is completed. The invention's dielectric block covers the bird's beaks of the field oxide regions and enhances the e-field tolerance. The invention's e-field enhancement dielectric block relieves the e-field near the bird's beak, thus increasing the breakdown voltage of the transistor.

17 Claims, 6 Drawing Sheets

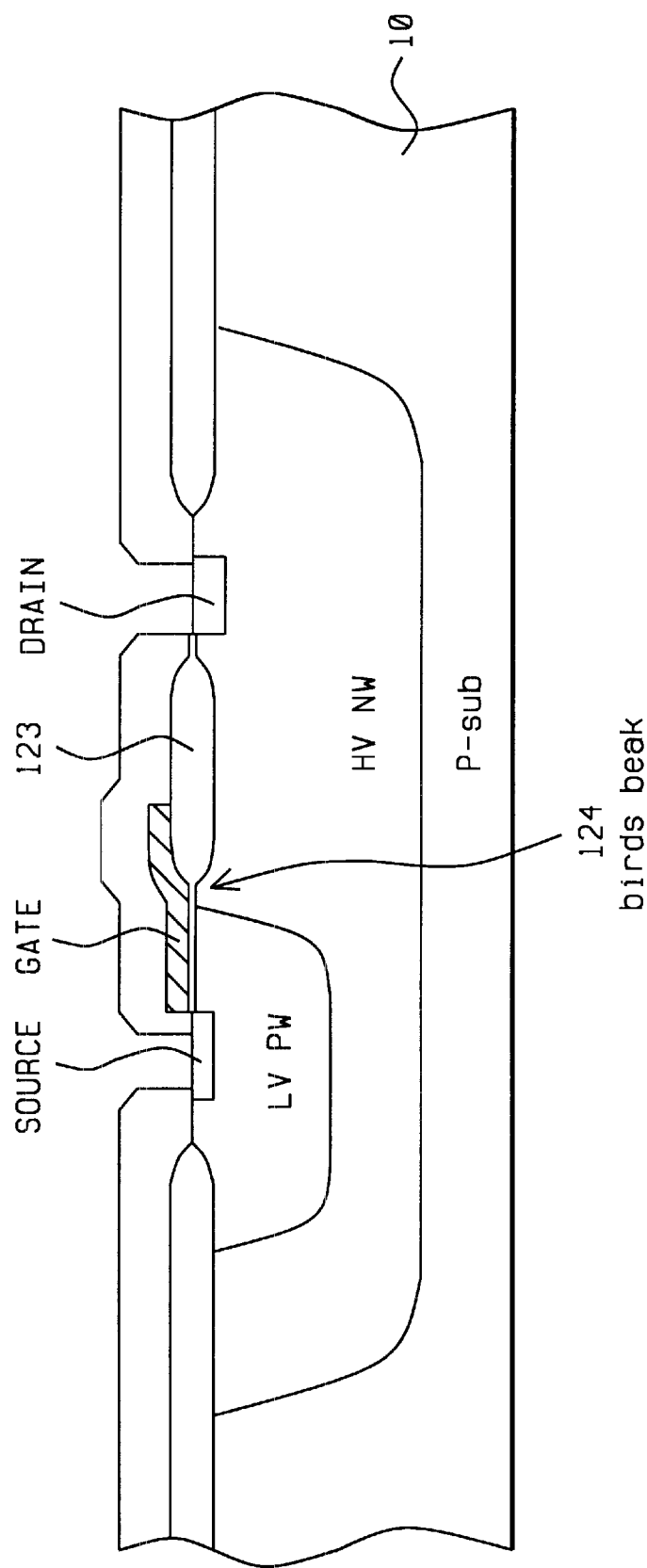
FIG. 6 – Prior Art

METHOD OF FABRICATING A LDMOS TRANSISTOR

BACKGROUND OF INVENTION

1) Field of the Invention

This invention relates generally to fabrication of semiconductor devices and more particularly to a method to fabricate of a lateral diffused Metal oxide semiconductor (LDMOS) transistor.

2) Description of the Prior Art

In many applications it is desirable to have a variety of logic devices, memory devices and device capable of withstanding large transients (hereon referred to as power devices) all on a single substrate. On type of power device is a diffused metal-oxide- semiconductor transistor (Tx) (DMOS).

Heretofore most lateral diffused Metal oxide semiconductor, (LDMOS) structures built on a substrate with one or more other device structures were formed by first forming a high voltage tank. The devices are isolated by field oxide (FOX) processes or shallow trench isolation (STI) regions. However, in a critical understanding, the inventors have found that the isolation (e.g., FOX) regions under the gate electrode have problems that lower the breakdown voltage.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,242,841 (Smayling et al.) and U.S. Pat. No. 5,491,105 (Smayling et al.) show LDMOS Tx processes.

U.S. Pat. No. 5,639,676 (Hshieh et al.) shows a trenched DMOS Tx process. U.S. Pat. No. 5,474,943 (Hshieh et al.) teaches a short trenched channel DMOS TX process.

However, an improved LDMOS process is needed that improves the breakdown voltages and reduces the problems with low breakdowns associated with the field oxide (FOX) regions.

SUMMARY OF THE INVENTION

It is an object of the present invention to provide a method for fabricating a semiconductor device.

It is an object of the-present invention to provide a method for fabricating a lateral diffused Metal oxide semiconductor (LDHOS) Transistor.

It is an object of the present invention to provide a method to improve the breakdown voltage of the LDMOS.

To accomplish the above objectives, the present invention provides a method of manufacturing a LRMOS transistor having an e-field enhancement block under the gate electrode.

The invention begins by providing a high voltage well and a low voltage well in the substrate. Next, a first field oxide region is formed overlapping the low voltage and high voltage wells. The first field oxide region has bird beaks. Next, an important (e-field tolerance enhancement) dielectric block is formed over the bird beaks of the first field oxide region. After this the LDMOS device is completed by forming a gate stack over the dielectric block.

The invention's e-field enhancement dielectric block layer covers the bird's beaks of the field oxide regions. This e-field enhancement oxide layer relieves the e-field near the bird's beak, thus increasing the Breakdown voltage (BV) of the LDMOS transistor. According to simulations, the BV is improved by as much as 30%. The drain current the invention's device is larger than the conventional device, which enhances the current driving capability of the circuit.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 6 is a cross sectional view of a LDMOS transistor of the prior art that has a field oxide region 123 with a bird's beak 124 under the poly gate that causes the problem of low breakdown voltage.

FIG. 7c has S=2 and FIG. 7D has S=6.

DETAILED DESCRIPTION OF THE PREFERRED EMBODIMENTS

Figure 1:
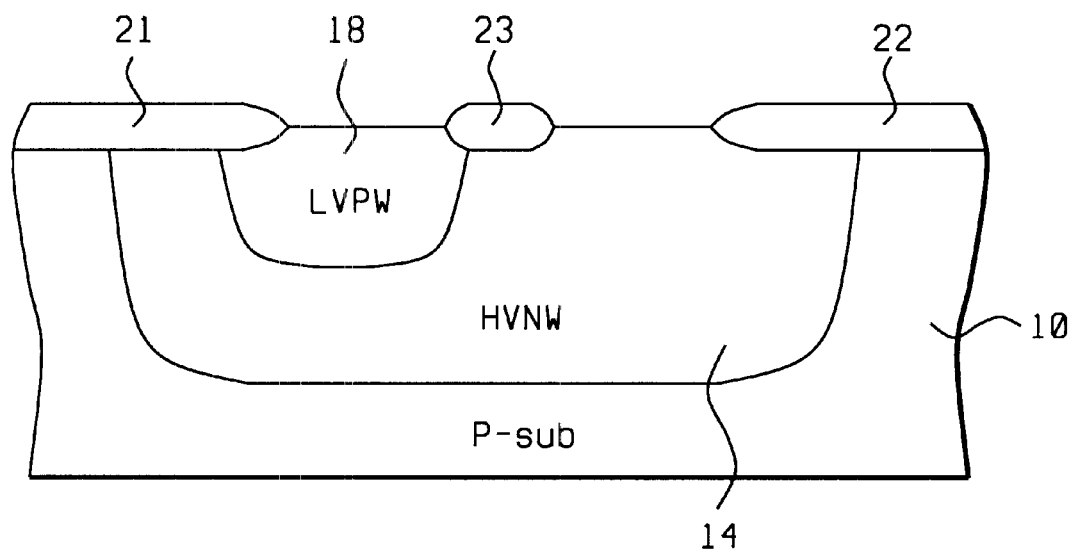
FIGS. 1 through 4 and 5A are cross sectional views for illustrating a method for manufacturing a LDMOS transistor according to the present invention.

A. The Problem Invention Solves—Bird's Beak Under Gate

Referring now to the drawings and more particularly to FIG. 6, there is shown a LDMOS structure, known to the inventors, over which the present invention is an improvement. It is to be understood in this regard that no portion of FIG. 6 is admitted to be prior art towards the determination of patentablity (e.g., obviousness) of the present invention. Rather, this highly simplified diagram is an effort to provide an improved understanding of the problems that are overcome by the invention.

In FIG. 6, the bird's beak 124 (e.g., edge region) (e.g., 124 between the channel, gate and the drain) of the field oxide 123 causes problems with the electric field in this area. The inventors have found that the bird's beak 124 (edge region) reduces the breakdown voltage of the device. The realization of this problem is a critical part of the invention. region (e.g., drain) 54. The invention's novel e-field enhancement layer 40 overlies the prior art's (see FIG. 6) bird's beak 124 of the field oxide region 123.

A brief process flow of a preferred embodiment of the invention's key steps is shown below. The steps labeled Key steps are the invention's novel steps.

Figure 2:
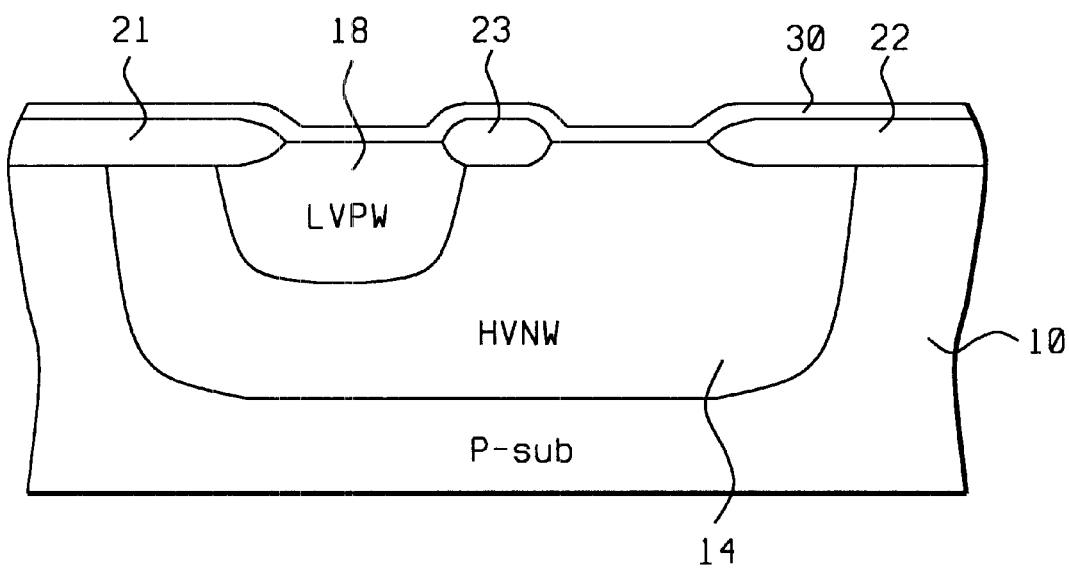

BRIEF PROCESS FLOW field oxidation 22 23=See FIG. 2

BOE 50:1

Si₃N₄ strip

HF 50:1 pad oxide removal standard clean sacrificial (SAC) oxide

Figure 3:
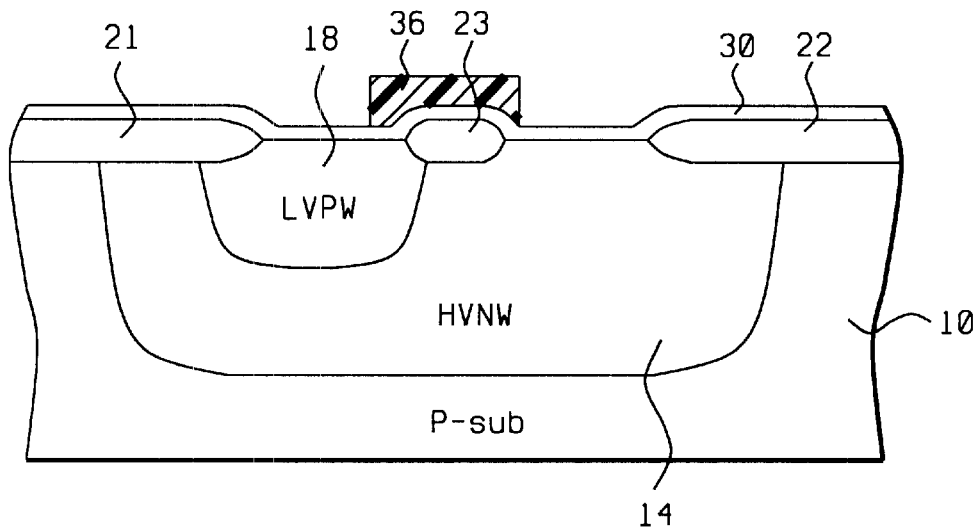

KEY step—dielectric (e.g., TEOS) deposition 30—FIG. 3

Figure 4:
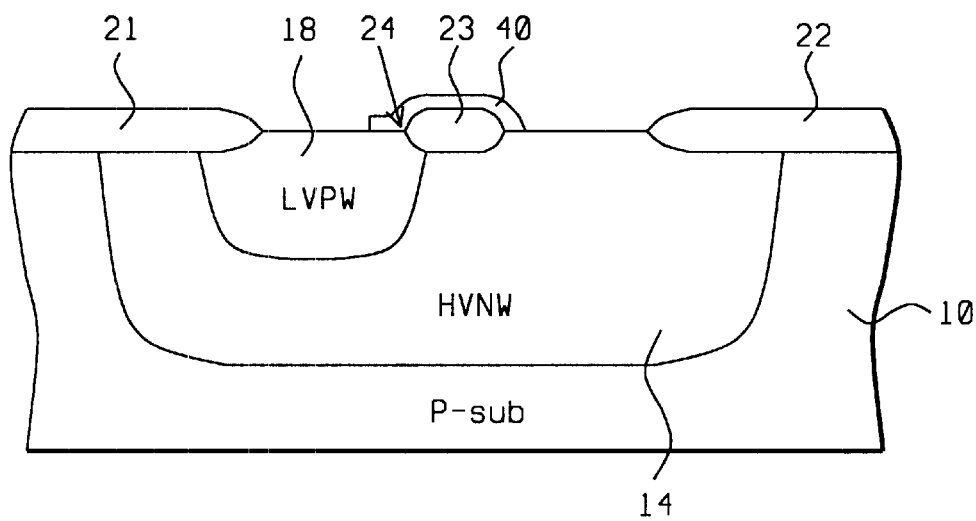

KEY step—photoresist coat 36/develop—FIG. 4

Key Step—Etch dielectric layer 30 (TEOS) layer 30 to form e-field enhancement layer (teos) 40 that overlies the bird's beak 24 of the Field oxide 23

Figure 5A:
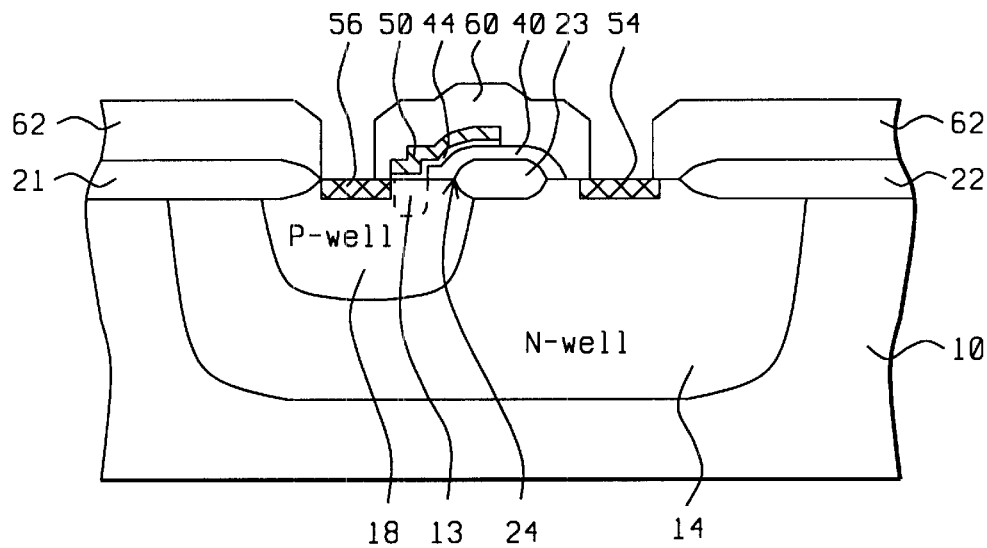

KEY step—photoresist 35 removal—FIG. 5A

HF 50:1

Gate oxidation—FIG. 5A

Poly deposition—FIG 5A

The invention's method can be summarized as shown below:

a) See FIG. 1—forming a high voltage N-well (HV NW) 14 in a substrate 10;

b) forming a low voltage P-well (LV PW) 18 within the high voltage N-well (HV NW) 14;

c) FIG. 1 forming a first field oxide 23 that at least partially overlaps the low voltage P-well (LV PW) 18 and the high voltage N-well (HV NW) 14;

d) FIG. 2 depositing a dielectric layer 30 (TEOS) over the substrate and the first field oxide region 23;

e) FIG. 3 forming a resist pattern 36 over dielectric layer 30; the resist pattern having openings a portion of the low voltage p-well (LVPW) 18 and a portion of the high voltage n-well 14;

f) See FIG. 4 etching the dielectric layer 30 through the opening in the resist pattern 36 to leave an e-field enhancement dielectric block 40 over the first field oxide region 23 and a portion of the low voltage p-well (LVPW) 18 adjacent to the first field oxide region;

g) See FIG. 4 removing the resist pattern 36;

h) See FIG. 5 forming a gate stack over the dielectric block 40, the low voltage p-well, and the first field oxide region 23; the gate stack comprised of a gate dielectric layer 44 and a gate electrode 50;

i) See FIG. 5 forming a first doped region (e.g., source region) 56 in the low voltage p-well 18 adjacent to the gate structure 44 50 and a second doped region (e.g., a drain) 54 in the HV N-well 14; and j) FIG. 5A forming an interlevel dielectric layer 62 over the substrate surface thereby completing the LDMOS transistor.

DETAILED DESCRIPTION

A. Wells

As shown in FIG. 1, we form a high voltage well (e.g., HV n-well) 14 in a substrate 10.

Next, we form a low voltage well (LV PW) 18 within the high voltage well (e.g., HV N-well) 14.

Note that the dopant types for the low voltage and high voltage layers can be reversed. That is the low voltage well can be n-type and the high voltage well can be p-type.

B. Pad Oxide and SiN

Still referring to FIG. 1, we form a pad dielectric layer and barrier layer over substrate 10. The pad dielectric layer and the barrier layer have openings that define isolation areas in the substrate 10.

The pad oxide layer is preferably comprised of silicon oxide having a thickness of between about 100 and 700 Å.

The barrier layer is preferably composed of silicon nitride.

C. Field Oxide Regions

Next, we form isolation regions 21 22 23 in the substrate. The isolation regions can be shallow trench isolation (STI) or field isolations. Preferably we form field isolations (FOX) 21 22 23 by oxidizing the silicon substrate 10 through the opening in the pad dielectric layer and the barrier layer. The oxidation create bird's beaks 24 in the field oxide.

Next, in an option step, we perform a BOE 50:1 etch to remove the native oxide.

In an alternate process, the field oxide regions can be formed by a shallow trench isolation (STI) process. The STI process does not form bird's beaks, but can have stresses or other irregularities near the oxide and substrate interfaces.

D. Remove Barrier Layer and Lad Lxide Layer

As shown in FIG. 2, we remove the barrier layer 16 and the pad oxide layer 15.

Subsequently, we perform a clean.

Next, in an optional step, we form a sacrificial (SAC) oxide layer (not shown) over the substrate and the field oxide regions 22. The SAC layer is formed to reduce the KOOI effect and clean the silicon surface. It is also a means to attract impurity in the surface to purify the silicon surface.

E. Efield Dielectric Block 40

In a critical step of the invention, (see FIG. 4) a dielectric block 40 is formed over the first field oxide region 40 and a portion of the low voltage well 18. The dielectric block covers the bird's beaks 24 in the first field oxide region and enhances the e-field of the device.

As shown in FIG. 3, to form the dielectric block 40, preferably we deposit a dielectric layer 30 (TEOS) over the sacrificial oxide layer. It is important the dielectric layer is deposited, not grown. By growing the dielectric layer, the bird's beak problem is worsened.

A shown in FIG. 3, we form a resist pattern 36 over dielectric layer 30 layer. The resist pattern having openings over a portion of the low voltage p-well (LVPW) 18 and a portion of the high voltage n-well 14.

As shown in FIG. 4, we etch the dielectric layer 30 through the opening in the resist pattern 36 to form an e-field enhancement dielectric block 40 over the first field oxide region 23 and a portion of the low voltage p-well (LVPW) 18 adjacent to the first field oxide region. It is critical that the dielectric block 40 overlies the bird's beak under the poly gate (that is subsequently formed). The e-field dielectric block 40 preferably has a thickness of between about 1000 and 8000 Å. The e-field block 40 is preferably formed by a PECVD process using tetraethylorthosilicate (TEOS).

As shown in FIG. 4, we remove the resist pattern 36.

The invention's e-field enhancement oxide block covers the bird's beaks of the field oxide regions. This e-field enhancement oxide layer relieves the e-field near the bird's beak, thus increasing the Breakdown Voltage of the LDMOS transistor. It is critical that the gate is not formed over a STI region or a field oxide region.

F. Gate Dielectric Layer, Gate, S/D

As shown in FIG. 5A, we form a gate stack over the dielectric block, a portion of the well 18 and possibly over a portion of the well 14.

To form the gate stack, first we form a gate dielectric layer 44 over the substrate 10. Then, we deposit a gate conductor layer (Not shown).

The gate conductor layer is patterned to form a gate electrode 50. It is critical that the gate electrode overlies at least a portion the e-field protection block 40. This is a main point of the invention.

Still referring to FIG. 5A, we form first and second doped regions (e.g., source and drain regions).

Subsequently, an interlevel dielectric layer 62 is formed over the substrate surface thereby completing the LDMOS transistor.

Figure 5B:
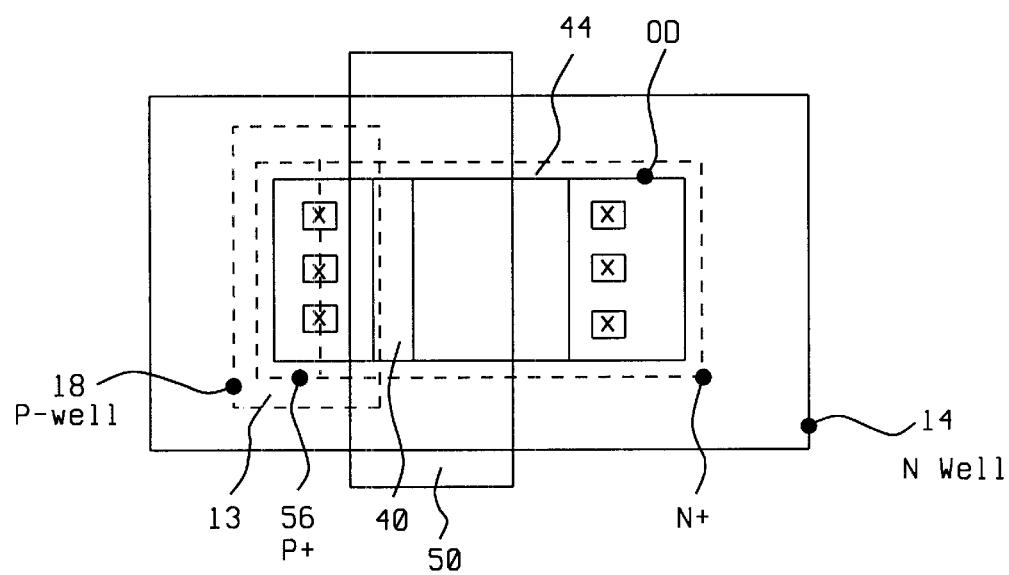
FIG. 5B is a top plan view for illustrating a method for manufacturing a LDMOS transistor according to the present invention.

FIG. 5B shows a top down view of the invention's dielectric block 40.

Figure 7A:
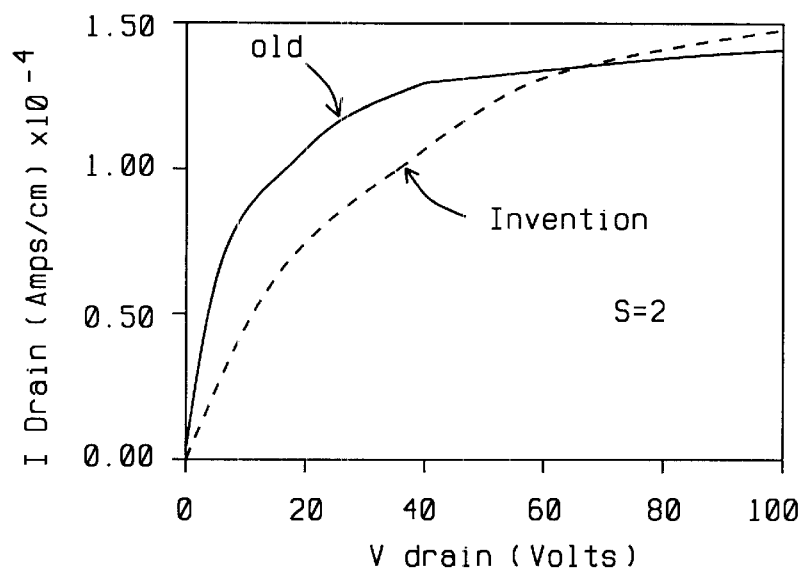
FIGS. 7A and 7B are graphs of the $V_{drain}$ vs $I_{drain}$ for the LDMOS Tx with the invention's Block 40 (New) and without the invention's block (old).
Figure 7B:
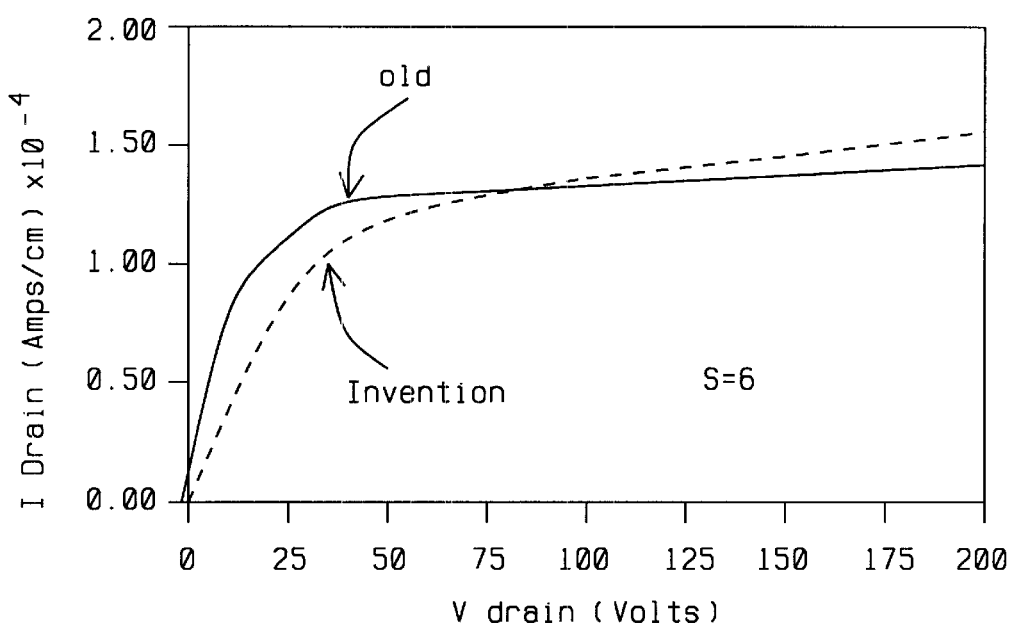

G. Examples FIGS. 7a and 7B are graphs of the $V_{drain}$ vs $I_{drain}$ for the LDMOS Tx with the invention's Block 40 (New) and without the invention's block (old). FIG. 7A has S=2 and FIG. 7B has S=6. The y-axis units are Amps/$\mu$m 1.0E-4. The "old" test device is as shown in FIG. 6 with the gate over the bird's beak 124.

Figure 7C:
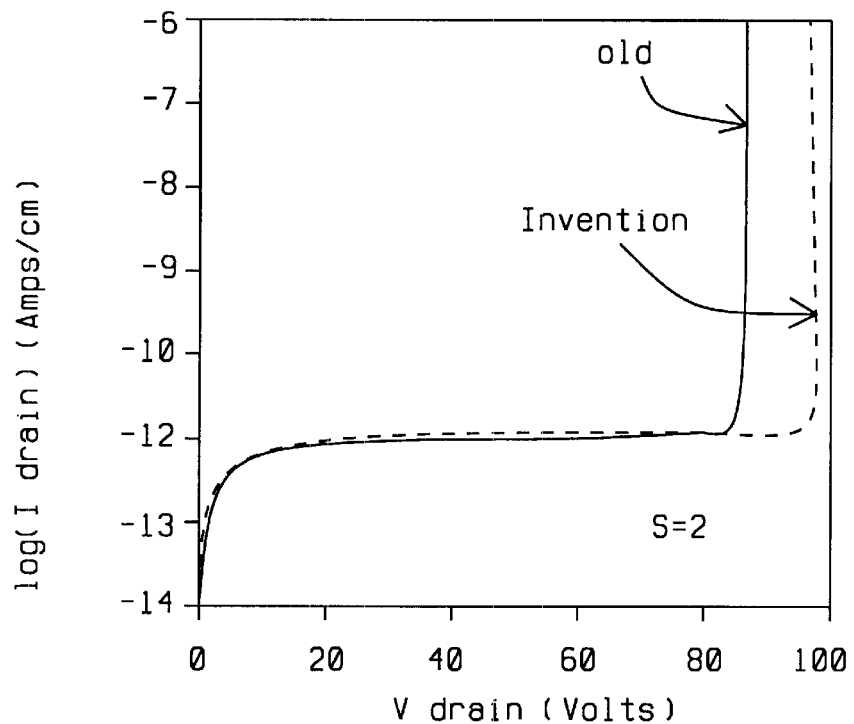
FIGS. 7C and 7D show graphs of the Vdrain vs log Idrain for the LDMOS Tx with the invention's dielectric Block 40 (New) and without the invention's block (old).
Figure 7D:
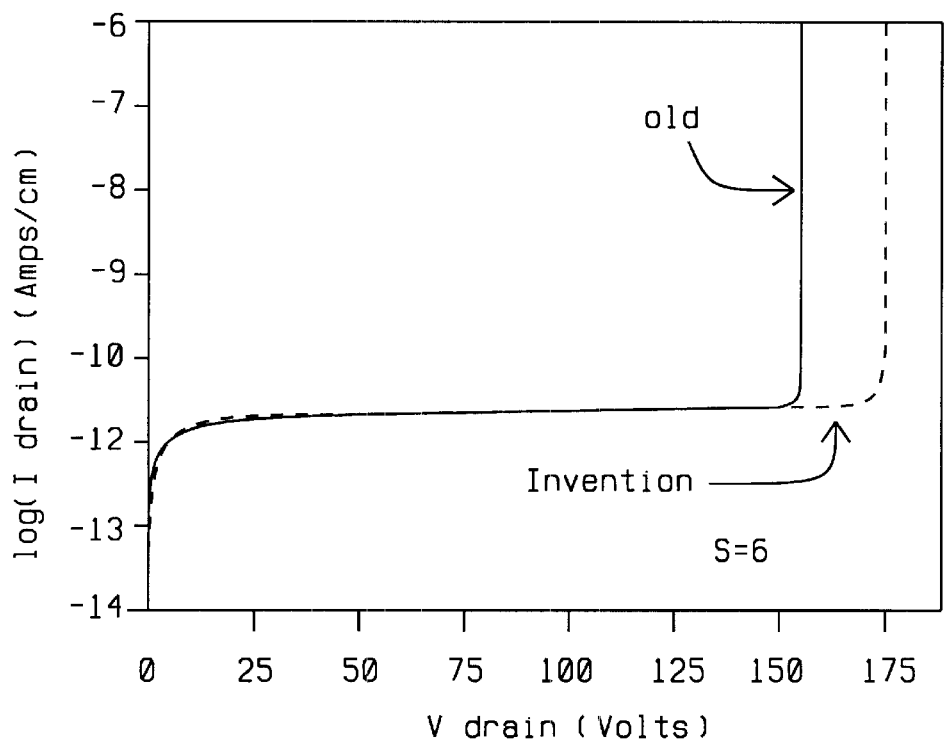

FIGS. 7C and 7D show graphs of the $V_{drain}$ vs log $I_{drain}$ for the LDMOS Tx with the invention's dielectric Block 40 and without the invention's dielectric block (old). FIG. 7C has S=2 and FIG. 7d has S=6. The y-axis units are Amps/m. The "old" test device is as shown in FIG. 6 with the gate over the bird's beak 124 and does not have the invention's dielectric block 40.

Note, the terms source and drain mean doped regions in the substrate. The source and drain are electrically determined by the voltages applied. Therefore the source and drain can be interchanged when interpreting the invention.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a lateral diffused metal oxide semiconductor transistor; comprising the steps of:
   a) forming a first field oxide region in a substrate;
   b) forming a dielectric block over said first field oxide region and said substrate;
   c) forming a gate stack over a portion of said dielectric block, said substrate, and said first field oxide region; said gate stack comprised of a gate dielectric layer and a gate electrode;
   d) forming a first doped region adjacent to said gate stack and a second doped region in said substrate; and
   e) forming an interlevel dielectric layer over the substrate surface thereby completing the transistor.

2. A method of fabricating a lateral diffused metal oxide semiconductor transistor; comprising the steps of:
   a) forming a high voltage well in a substrate;
   b) forming a low voltage well within said high voltage well;
   c) forming a first field oxide region that at least partially overlaps said low voltage well and said high voltage well;
   d) forming a dielectric block over said first field oxide region and a portion of said low voltage well adjacent to said first field oxide region;
   e) forming a gate stack over a portion of said dielectric block, said low voltage well, and said first field oxide region; said gate stack comprised of a gate dielectric layer and a gate electrode;
   f) forming a first doped region in said low voltage well adjacent to said gate stack and a second doped region in said high voltage well; and
   g) forming an interlevel dielectric layer over the substrate surface thereby completing the LDMOS transistor.

3. The method of claim 1 wherein said field oxide region is formed by the steps comprised of: forming a pad oxide layer and a barrier layer over the substrate;
   forming an opening in said pad oxide and said barrier layer that exposes said substrate; and
   oxidizing the exposed substrate to form said first isolation region.

4. The method of claim 1 wherein said first field oxide region is formed by the steps comprised of: forming a pad oxide layer and a barrier layer over the substrate; said pad oxide layer comprised of silicon oxide having a thickness of between about 100 and 700 Å;
   forming an opening in said pad oxide and said barrier layer that exposes said substrate; and
   oxidizing the exposed substrate to form said first isolation region.

5. The method of claim 3 wherein said barrier layer is comprised of silicon nitride.

6. The method of claim 1 wherein said dielectric block has a thickness of between about 1000 and 8000 Å.

7. The method of claim 1 wherein said dielectric block is formed by a PECVD process using tetraethylorthosilicate.

8. The method of claim 1 wherein said first field Oxide region is formed by a thermal oxidation process that causes a bird's beak.

9. The method of claim 2 wherein said low voltage well is doped with p-type dopants and said high voltage well is doped with n-dopants.

10. The method of claim 2 wherein said low voltage well is doped with n-type dopants and said high voltage well is doped with p-dopants.

11. A method of fabricating a lateral diffused Metal oxide semiconductor transistor; comprising the steps of:
   a) forming a high voltage N-well in a substrate;
   b) forming a low voltage P-well within said high voltage N-well;
   c) forming a first field oxide region using a oxidation process and said first field oxide region at least partially overlaps said low voltage P-well and said high voltage N-well;
   d) depositing a dielectric layer over said substrate and said first field oxide region;
   e) forming a resist pattern over dielectric layer; said resist pattern has openings over a portion of said low voltage p-well and a portion of said high voltage n-well;

f) etching said dielectric layer through said opening in said resist pattern to leave an dielectric block over said first field oxide region and a portion of said low voltage p-well adjacent to said first field oxide region;

g) removing said resist pattern;

h) forming a gate stack over at least a portion of said dielectric block, said low voltage p-well, said first field oxide region; said gate stack comprised of a gate dielectric layer and a gate electrode;

i) forming a first doped region in said low voltage p-well adjacent to said gate structure and a second doped region in said HV N-well; and j) forming an interlevel dielectric layer over the substrate surface thereby completing the LDMOS transistor.

12. The method of claim 11 wherein said first field oxide region is formed by the steps comprised of: forming a pad oxide layer and a barrier layer over the substrate;

forming an opening in said pad oxide and said barrier layer that exposes said substrate; and oxidizing the exposed substrate to form said first field oxide region.

13. The method of claim 11 wherein said first oxide region is formed by the steps comprised of:

forming a pad oxide layer and a barrier layer over the substrate; said pad oxide layer comprised of silicon oxide having a thickness of between about 100 and 700 Å;

forming an opening in said pad oxide and said barrier layer that exposes said substrate; and oxidizing the exposed substrate to form said first field oxide region.

14. The method of claim 12 wherein said barrier layer composed of silicon nitride.

15. The method of claim 11 wherein said dielectric block has a thickness of between about 1000 and 8000 Å.

16. The method of claim 11 wherein said dielectric block is formed by a PECVD process using tetraethylorthosilicate (TEOS).

17. The method of claim 11 wherein said low voltage p-well is doped with N-type dopants and said high voltage n-well is doped with p-dopants.

* * * * *